(12) United States Patent
Koumoto

(10) Patent No.: US 11,346,867 B2
(45) Date of Patent: May 31, 2022

(54) FACILITY STATE MONITORING SYSTEM, ANALYSIS APPARATUS, METHOD, AND PROGRAM

(71) Applicant: NEC Corporation, Tokyo (JP)

(72) Inventor: Shigeru Koumoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 4 days.

(21) Appl. No.: 16/961,417

(22) PCT Filed: Jan. 17, 2018

(86) PCT No.: PCT/JP2018/001248
§ 371 (c)(1),
(2) Date: Jul. 10, 2020

(87) PCT Pub. No.: WO2019/142273
PCT Pub. Date: Jul. 25, 2019

(65) Prior Publication Data
US 2020/0379020 A1    Dec. 3, 2020

(51) Int. Cl.
*G01R 19/25*  (2006.01)
*G08C 15/06*  (2006.01)

(52) U.S. Cl.
CPC ......... *G01R 19/2509* (2013.01); *G08C 15/06* (2013.01)

(58) Field of Classification Search
CPC ............ G01R 19/2513; G01R 19/2509; G08C 15/06; G08C 15/00; G05B 19/0426; G05B 23/024
See application file for complete search history.

(56) References Cited

U.S. PATENT DOCUMENTS

| | | | |
|---|---|---|---|
| 2015/0006096 A1* | 1/2015 | Helmschmidt | G01D 4/00 702/66 |
| 2018/0157883 A1* | 6/2018 | Cumoli | G06K 7/10732 |
| 2019/0028782 A1* | 1/2019 | Matsumoto | H04Q 9/00 |

FOREIGN PATENT DOCUMENTS

| | | |
|---|---|---|
| JP | S57-190212 A | 11/1982 |
| JP | H05-080118 A | 4/1993 |
| JP | H08-307962 A | 11/1996 |
| JP | H10-011681 A | 1/1998 |
| JP | 2004-110602 A | 4/2004 |
| JP | 2013-044736 A | 3/2013 |
| JP | 2016018242 A * | 2/2016 |
| WO | 2013/157031 A1 | 10/2013 |
| WO | 2015/097845 A1 | 7/2015 |

OTHER PUBLICATIONS

International Search Report for PCT Application No. PCT/JP2018/001248, dated Apr. 17, 2018.

* cited by examiner

*Primary Examiner* — Tarun Sinha
*Assistant Examiner* — Yossef Korang-Beheshti

(57) ABSTRACT

A measurement apparatus that measures a facility of a measurement target and that is able to transmit measurement data as intermittent data and an analysis apparatus. An analysis apparatus includes: a communication part that receives the intermittent data from the measurement apparatus; and an analysis part that estimates a standard data pattern serving as a reference, based on a common portion between a pair of the data in a set of the intermittent data received and determines presence of an anomaly for intermittent data of a determination target received from the measurement apparatus by referring to the standard data pattern.

15 Claims, 16 Drawing Sheets

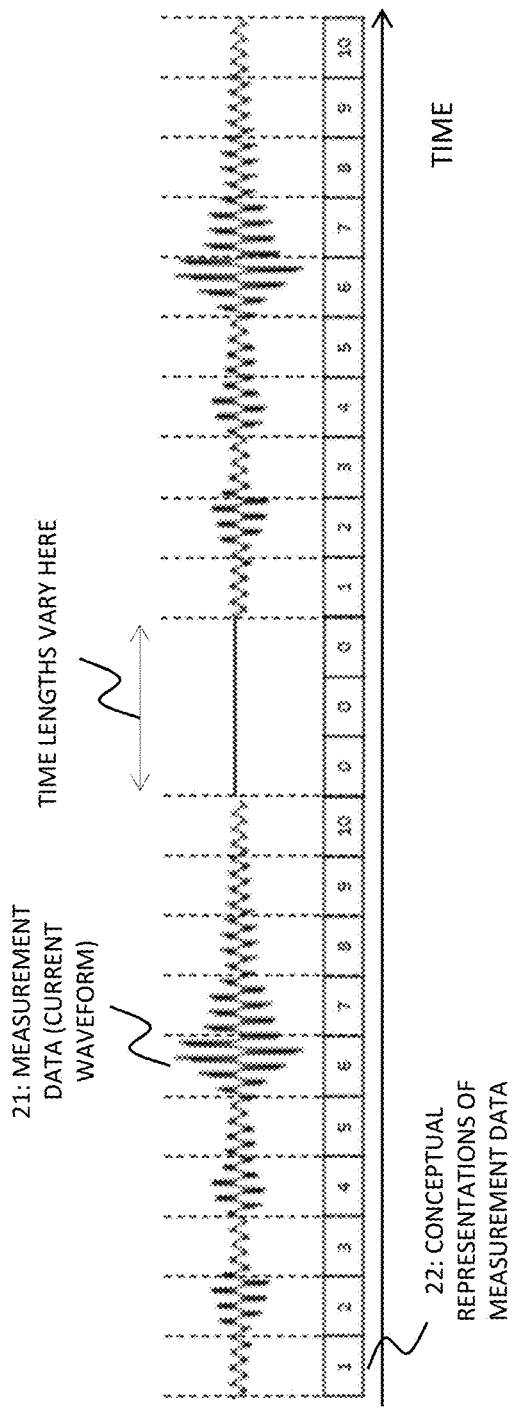

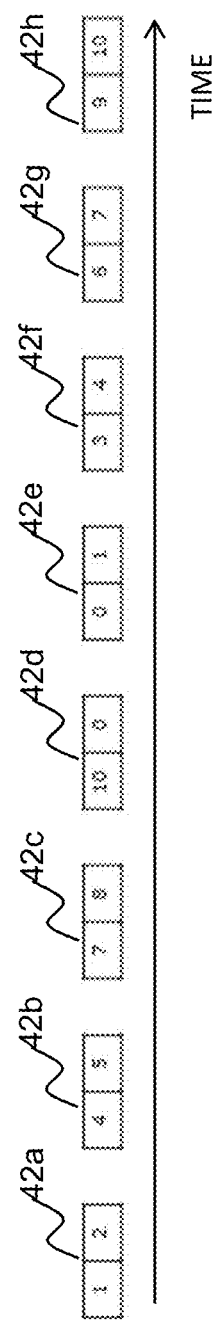

TIME

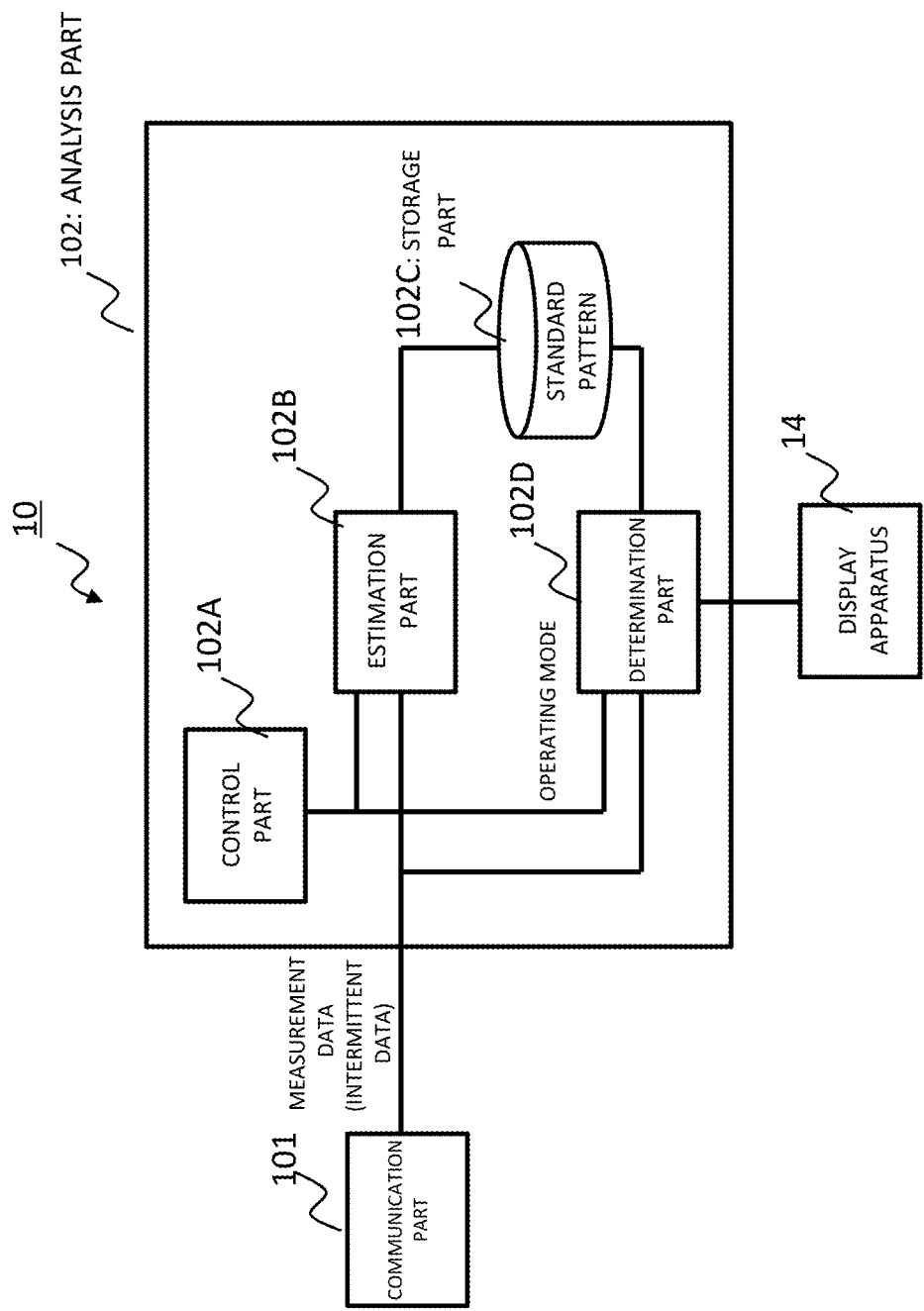

FACILITY STATE MONITORING SYSTEM, ANALYSIS APPARATUS, METHOD, AND PROGRAM

This application is a National Stage Entry of PCT/JP2018/001248 filed on Jan. 17, 2018, the contents of all of which are incorporated herein by reference, in their entirety.

FIELD

The present invention relates to a facility state monitoring system, analysis apparatus, method, and program.

BACKGROUND

In a manufacturing industry or the like, it is desired to maintain and improve production efficiency and quality by monitoring an operating state of a facility to quickly catch change or anomaly in an operating rate and take necessary measures. For example, by sensing a signal waveform (any one or more of current, voltage, or power waveform, mechanical vibration waveform, temperature, and sound) of an individual manufacturing facility (simply referred to as "facility" hereinafter) using a sensor(s) and monitoring sensed data, detection of an operating rate of the facility and anomaly or a sign of anomaly is performed.

In this case, time-series data of power supply current and electric power, when a facility is operating normally is acquired through a sensor device in advance, a model on an operating state of the facility (for example, a probabilistic transition model such as HHM (Hidden Markov Model), a machine learning model such as a classifier, and a statistical model such as variation of time-series data) is learned or stored, and, when the facility is monitored, based on the learned model, decision of presence/absence of anomaly is performed from time-series data of power supply current, electric power, etc., newly obtained by the sensor.

For example, Patent Literature 1 discloses a configuration in which a type, an operating state and a current waveform pattern corresponding to the operation state of an electrical apparatus are stored, and a type and an operating state of the electrical apparatus are estimated by comparing the current waveform pattern stored with an actual current waveform.

Further, Patent Literature 2 discloses a configuration in which learned data associating waveform data of a harmonic current, an operating status information indicating an operating status of an electrical apparatus when the waveform data generates, and section specifying information to specify a preset waveform data comparison target section in one cycle of an AC voltage applied to the electrical apparatus is acquired, and an operating status of the electrical apparatus is determined, based on a result of collating, for the waveform data comparison target section, the waveform data of the harmonic current related to the acquired learned data with the waveform data of the harmonic current measured by a harmonic current measurement part.

In the Internet of Things (IoT), for example, data is collected from sensors mounted in things and the data is analyzed on a cloud server. It has become impossible for a cloud server to process all data from IoT devices such as sensors in view of processing performance, communication bandwidth, etc. Hence, such a mode in which on a side of an edge apparatus (edge node, edge terminal), data is processed to some extent and forwarded to a cloud side is used.

In an example schematically illustrated in FIG. 1A, for example, a measurement apparatus 11 may be an IoT apparatus including a sensing function of detecting a state of a facility (not shown) and a communication function of performing wired or wireless transmission of sensed data. The measurement apparatus 11, as in an example thereof schematically illustrated in FIG. 1B, includes current sensor 111-1 as a sensor, connected to a power supply path (for example AC power source) of a facility 30, detecting a power supply current, converts an analog current waveform sensed by the current sensor 111-1 to a digital signal using an analog-to-digital converter (ADC) 111-2, and transmits the signal to a destination, i.e., an edge apparatus 12, from a communication part 112 via a communication network. The communication network may be, for example, a wired LAN (Local Area Network) such as Ethernet (registered trademark), a wireless LAN such as Wi-Fi (registered trademark) and Bluetooth, a carrier communication network (mobile communication network), or a WAN (Wide Area Network) such as the Internet. The communication part 112 includes a communication interface corresponding to a communication network connected and a communication controller. The communication part 112 transmits measurement data in a predetermined protocol data unit, such as a packet (frame).

The current sensor 111-1 may be configured to measure a voltage across terminals of a shunt resistor (not shown) inserted in a power line of the facility 30, for example. Alternatively, the current sensor 111-1 may be constituted by a CT (Current Transformer) sensor that is clipped around a power supply cable of a current measurement target and converting a detected value of magnetic flux flowing through a magnetic core to detect a current. The measurement apparatus 11 may be configured, for example, as an IoT apparatus constituted by a plug that is to be inserted into a power outlet (tap) and is made to have a power supply current measurement function and a communication function such that the plug has functions of measuring current and power of the facility 30 connected to the outlet and communicatively connecting to the Internet via, for example, a wireless LAN. Alternatively, the measurement apparatus 11 may be built into the facility 30. Note that FIG. 1B illustrates an example of the measurement apparatus 11 including the current sensor 111-1, however, the sensor is, as a matter of course, not limited to a current sensor.

Data to be transmitted by the measurement apparatus 11 to a cloud server 13 is processed by the edge apparatus 12 to some extent, and the data processed by the edge apparatus 12 is forwarded to the cloud server 13. The edge apparatus 12 may be an edge terminal, edge router, edge switch, edge server, edge gateway, or MEC (Mobility Edge Computing) server. Further, in a case where measurement data of a manufacturing facility is collected and analyzed, the edge apparatus 12 may be a gateway in an FEM (Factory Energy Management System).

In many cases, operation of a facility may include a repeating pattern initiated at any timing. FIG. 2A illustrates measurement data 21 of a facility (a current waveform (time-series data) of the facility) measured by the measurement apparatus 11 and a conceptual representation 22 thereof. In FIG. 2A, a time width of sections of an index 0 following an index 10 (three consecutive 0s in FIG. 2A) vary. The sections of the index 0 do not have to be included in a repeating pattern.

FIG. 2B illustrates a repeating pattern (current waveform data) extracted from the measurement data 21 in FIG. 2A and the conceptual representation 22 thereof (corresponding to the indexes 1 to 10 in FIG. 2A).

The edge apparatus 12 or the cloud server 13 may estimate (learn) a standard repeating pattern from the measurement data 21 through pattern matching, etc., as a non-limiting example.

The edge apparatus 12 or the cloud server 13 acquires measurement data from the measurement apparatus 11 and determines that the measurement apparatus 11 is in an abnormal operation when the measurement data deviates from an estimated standard repeating pattern.

When a high sampling rate is required for data measurement or when data from a plurality of the measurement apparatuses 11 are made to form multi-channels and subjected to parallel transmission, a processing performance of a processor (not shown) included in the edge apparatus 12 may not be able to cope with an amount of transmission data from a plurality of the measurement apparatuses 11. As a result, a receive buffer overflow or the like in the edge apparatus 12 may occur, which results in a delay in a communication line. There is also some cases in which a network bandwidth or the like may not be able to handle an amount of transmission data from a plurality of the measurement apparatuses 11.

Since a repeating pattern in measurement data occur at an arbitrary timing, the edge apparatus 12 and the cloud server 13 need to analyze time-continuous data.

If the measurement apparatus 11 performs transmission of measurement data decimated in time for reduction of an amount of transmission data, the edge apparatus 12 and the cloud server 13 will not be able to analyze time-continuous data.

With respect to transmission of a measurement waveform, for example, Patent Literature 3 discloses a configuration in which a wattmeter transmits one measurement result for a measurement instruction according to a command from a device identification device or the wattmeter performs measurement and transmits a measurement result at a constant section until being instructed to stop, a pattern identification unit determines whether a waveform pattern extracted by a feature extraction unit matches any waveform pattern in a list of waveform patterns measured and registered in advance to estimate an operation mode of a device.

Patent Literature 1

International Publication No. WO2015/097845

Patent Literature 2

Japanese Unexamined Patent Application Publication No. JP2013-44736A

Patent Literature 3

International Publication No. WO2013/157031

SUMMARY

As described above, there is a problem that an amount of transmission data increases when repeating pattern data acquired by a measurement apparatus is transmitted as it is. Especially with a system in which data from a plurality of (many) measurement apparatuses is collected and processed in a single place (edge apparatus, etc.), problems due to concentration of transmission data from the measurement apparatuses and increase in data amount are actualized.

Therefore, it is desirable to solve the above problem in grasping an operation pattern of a manufacturing facility wherein the operation pattern has a repeating pattern starting at an arbitrary timing.

The present invention is invented in view of the above problems, and it is an object thereof to provide a system, apparatus, method, and program, each enabling learning and analysis of measurement data while suppressing data concentration and an increase in data amount from a measurement apparatus(es).

According to an aspect of the present invention, there is provided a facility state monitoring system including: a measurement apparatus that measures a facility of a measurement target and that is able to transmit measurement data as intermittent data; and an analysis apparatus. The analysis apparatus includes: a communication part that receives the intermittent data from the measurement apparatus; and an analysis part that estimates a standard data pattern serving as a reference, based on a common portion between a pair of the data in a set of the intermittent data received and determines presence of an anomaly for intermittent data of a determination target received from the measurement apparatus by referring to the standard data pattern.

According to an aspect of the present invention, there is provided an analysis apparatus comprising: a communication part that receives intermittent data from a measurement apparatus capable of transmitting measurement data as the intermittent data; and an analysis part, wherein the analysis part includes: an estimation part that estimates a standard data pattern serving as a reference based on a common portion between a pair of the data in a set of the intermittent data received from the measurement apparatus; and a determination part that determines presence of an anomaly for intermittent data of a determination target received from the measurement apparatus by referring to the standard data pattern.

According to an aspect of the present invention, there is provided a facility state monitoring method including:

receiving intermittent data from a measurement apparatus capable of transmitting measurement data of a facility of a measurement target as the intermittent data;

estimating a standard data pattern serving as a reference based on a common portion between a pair of the data in a set of the intermittent data received from the measurement apparatus; and determining presence of an anomaly for intermittent data of a determination target received from the measurement apparatus by referring to the standard data pattern.

According to an aspect of the present invention, there is provided a program causing a computer to execute processing comprising:

receiving intermittent data from a measurement apparatus capable of transmitting measurement data of a facility of a measurement target as the intermittent data;

estimating a standard data pattern serving as a reference based on a common portion between a pair of the data in a set of the intermittent data received from the measurement apparatus; and determining presence of an anomaly for intermittent data of a determination target received from the measurement apparatus by referring to the standard data pattern.

According to the present invention, there is provided a computer-readable recording medium (for example a non-transitory computer-readable recording medium such as a hard disk drive, compact disc, semiconductor storage apparatus, etc.) storing the program.

According to the present invention, it becomes possible to learn or analyze measurement data while reducing an amount of transmission data from a measurement apparatus. Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2A is a diagram illustrating measurement data.

FIG. 4B is a diagram illustrating an example embodiment.

FIG. 6 is a diagram illustrating a configuration example of an analysis apparatus according to an example embodiment.

DETAILED DESCRIPTION

Figure 1A:
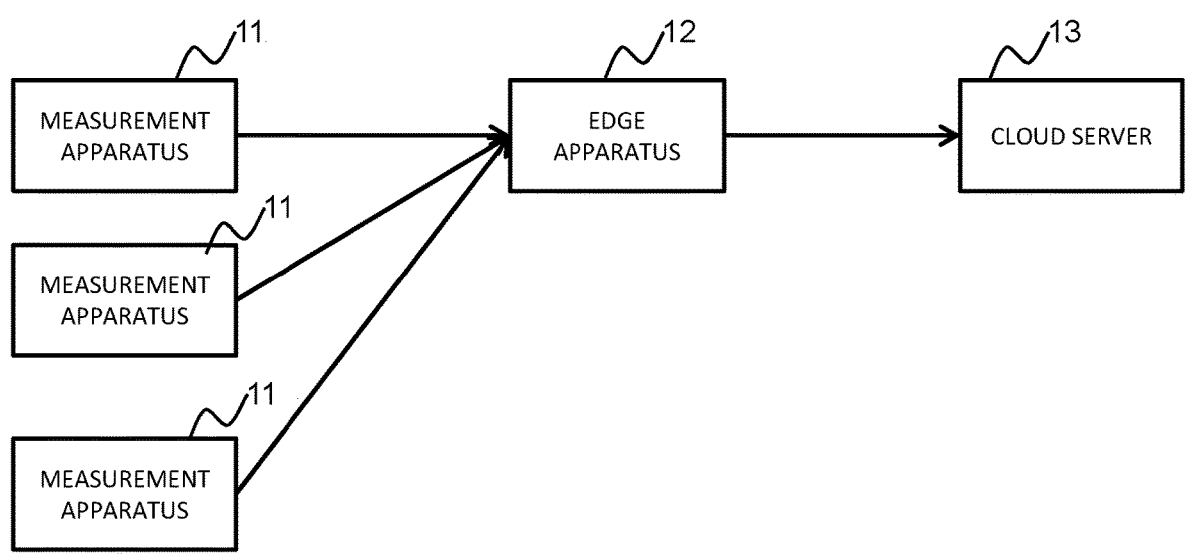
FIG. 1A is a diagram illustrating a system to which the present invention is applied.
Figure 3:
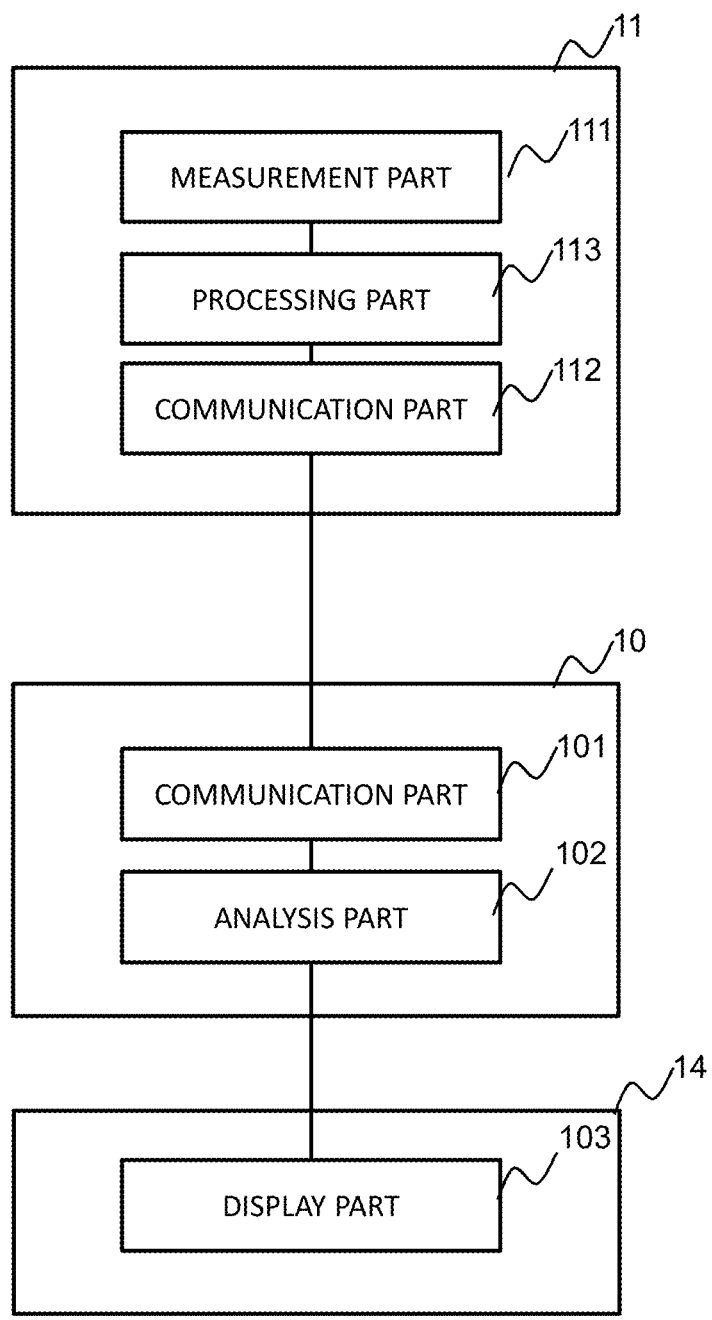
FIG. 3 is a diagram illustrating a configuration example of an example embodiment of the present invention.

The following describes an example embodiment of the present invention. For example, the present invention may be applied to the system illustrated in FIG. 1A. FIG. 3 is a diagram illustrating an example embodiment of the present invention. A measurement apparatus 11 in FIG. 3 may be used as the measurement apparatus 11 in FIG. 1A. The measurement apparatus 11 includes a measurement part 111, a communication part 112, and a processing part 113. An analysis apparatus 10 is an apparatus that analyzes measurement data and may be implemented in the edge apparatus 12 or in the cloud server 13 in FIG. 1A. Alternatively, the analysis apparatus 10 may be provided in a core switch (core router, etc.) provided in a network connected to the cloud server 13. The analysis apparatus 10 includes a communication part 101 that communicates with the measurement apparatus 11 and an analysis part 102 that analyzes measurement data. A display apparatus 14 includes a display part 103 that displays an analysis result. Note that the display apparatus 14 is configured to be a separate unit from the analysis apparatus 10 in the example illustrated in FIG. 3, but the analysis apparatus 10 may, as a matter of course, be configured to include the display part 103.

Figure 2B:
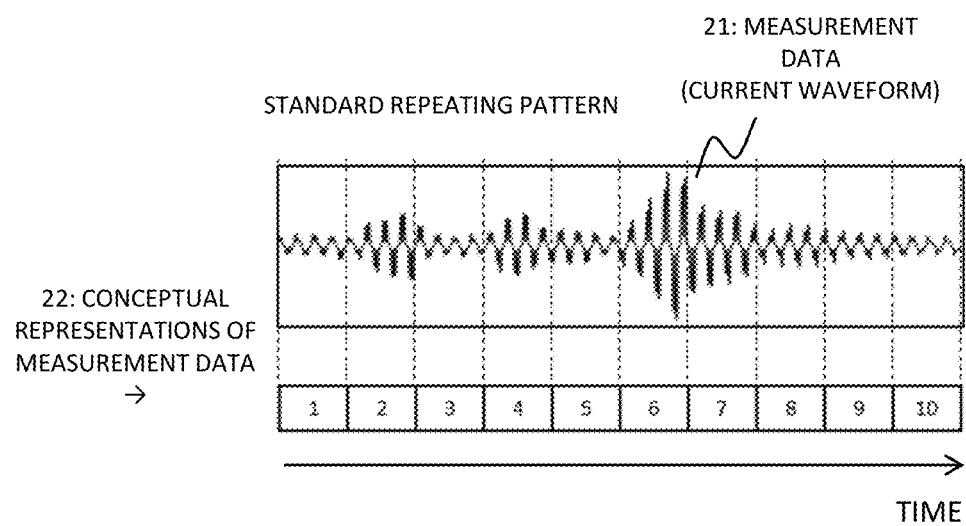
FIG. 2B is a diagram illustrating a repeating pattern in the measurement data.
Figure 4A:
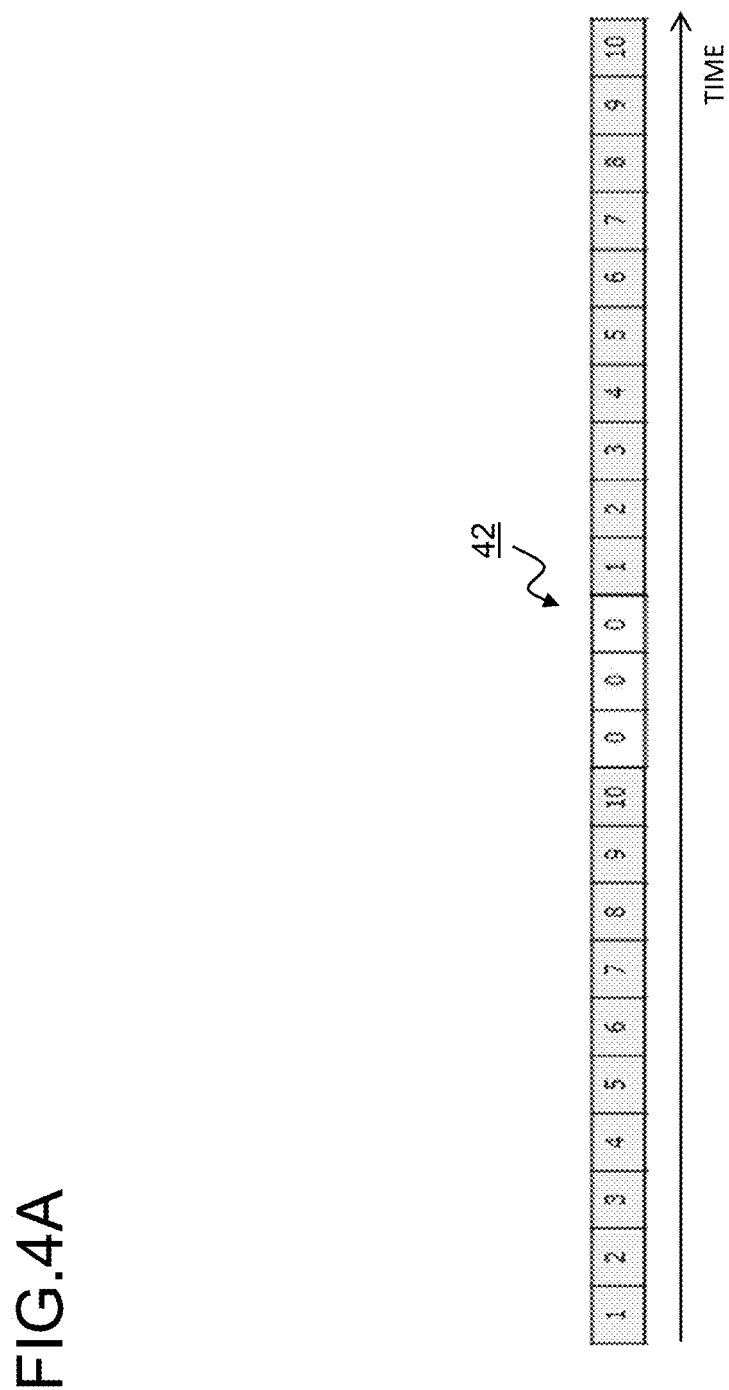
FIG. 4A is a diagram illustrating an example embodiment.

The following assumes that data measured by the measurement apparatus 11 is illustrated in FIG. 4A. 42 in FIG. 4A corresponds to the conceptual representation 22 of the measurement data (current waveform (time-series data) of the facility of a measurement target) illustrated in FIG. 2A. In FIG. 4A, the measurement data 21 (current waveform (time-series data) of the facility) in FIG. 2A is omitted and only indexes of the conceptual representation 22 corresponding to the measurement data 21 (the current waveform (time-series data) of the facility) are shown.

When the measurement apparatus 11 transmits measurement data to the analysis apparatus 10, the processing part 113 of the measurement apparatus 11 is able to transmit the measurement data (42 in FIG. 4A) as intermittent data obtained by decimating the data.

FIG. 4B is a diagram illustrating an example of the intermittent data (partial measurement data) transmitted from the measurement apparatus 11 to the analysis apparatus 10. In the example of FIG. 4B, the measurement apparatus 11 transmits intermittent data 42a to 42h in this order extracted from the conceptual representation 42 of the measurement data illustrated in FIG. 4A. The measurement apparatus 11 does not transmit data (decimated data) between adjacent ones of intermittent data 42a to 42h.

That is, in FIG. 4B, data of a section of index 3 in FIG. 4A is decimated between the intermittent data 42a and 42b, data of a section of index 6 in FIG. 4A is decimated between the intermittent data 42b and 42c, data of a section of index 9 in FIG. 4A is decimated between the intermittent data 42c and 42d, data of a section of index 0 in FIG. 4A is decimated between the intermittent data 42d and 42e, data of a section of index 2 in FIG. 4A is decimated between the intermittent data 42e and 42f, data of a section of index 5 in FIG. 4A is decimated between the intermittent data 42f and 42g, and data of a section of index 8 in FIG. 4A is decimated between the intermittent data 42g and 42h. When transmitting a packet (frame) per intermittent data, the measurement apparatus 11 performs intermittent transmission. The measurement apparatus 11 may transmit a packet (frame) in which a plurality of pieces of intermittent data are included.

In the example illustrated in FIG. 4B, each piece of the intermittent data 42a to 42h is constituted by data of two consecutive sections (two consecutive indexes of the conceptual representation) and has the same length. Between adjacent pieces of the intermittent data, data of one section (one conceptual representation index) is decimated. When the length of each piece of the intermittent data is the same (N) and so is the length (M) of each piece of the (decimated) data between adjacent pieces of the intermittent data, for the length (P) of the repeating pattern, P and (N+M) may be relatively prime (N=2, M=1, and P=10 in the example of FIG. 4B). The length of each piece of the intermittent data is the same and the length of each piece of the decimated data between adjacent pieces of the intermittent data is the same in FIG. 4B, as an example for explanation, but the length of each piece of the intermittent data may be different in the present example embodiment. The length of each piece of the decimated data between adjacent pieces of the intermittent data may also be different. Further, the lengths (the number of indexes) of the intermittent data and the decimated data may be set at random. Furthermore, the data transmitted by the measurement apparatus 11 may include both continuous data and intermittent data. In this case, for example, the measurement apparatus 11 may transmit measurement data as continuous data (no intermittent data included) in some time sections (time periods) and transmit measurement data as intermittent data in other time sections (time periods).

When estimating (learning) a standard pattern, the analysis apparatus 10 estimates a standard repeating pattern using common portions (data sections) of intermittent data received from the measurement apparatus 11 as a clue.

Figure 4C:
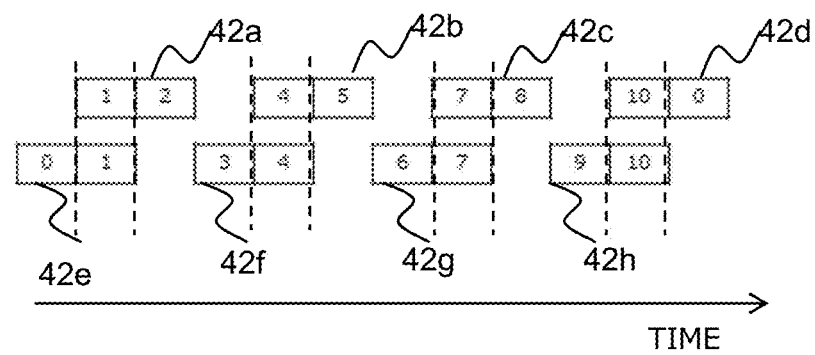
FIG. 4C is a diagram illustrating an example embodiment.

As schematically illustrated in FIG. 4C, the analysis apparatus 10 causes indexes 1 of the intermittent data 42a and 42e (time-series data), which are common sections (intersections) of the intermittent data 42a and 42e, in FIG. 4B to be laid to overlap each other on a time axis. The common sections (indexes 1) of the intermittent data 42a and 42e belong respectively of first and second cycles of the repeating pattern.

Similarly, the analysis apparatus 10 causes:

indexes 4 of the intermittent data 42b and 42f (time-series data) in FIG. 4B, which are common sections thereof, indexes 7 of the intermittent data 42c and 42g (time-series data) in FIG. 4B, which are common sections thereof, and the indexes 10 of the intermittent data 42d and 42h (time-series data) in FIG. 4B, which are common section thereof, to be laid to overlap on the time axis, respectively, as schematically illustrated in FIG. 4C.

The analysis apparatus 10 obtains waveforms (time-series data) of:

the indexes 0, 1, and 2 by causing the indexes 1 which are the common sections between the intermittent data 42a and 42e to overlap each other on the time axis, the indexes 3, 4, and 5 by causing the indexes 4 which are the common sections between the intermittent data 42b and 42f to overlap each other on the time axis, the indexes 6, 7, and 8 by causing the indexes 7 which are the common sections between the intermittent data 42c and 42g to overlap each other on the time axis, and the indexes 9, 10, and 0 by causing the indexes 10 which are the common sections between the intermittent data 42d and 42h to overlap each other on the time axis.

Figure 4D:
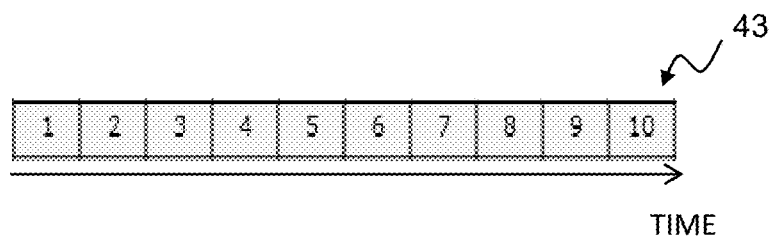
FIG. 4D is a diagram illustrating an example embodiment.

By overlaying these waveforms on the time axis, the analysis apparatus 10 obtains a pattern 43 of FIG. 4D.

This pattern 43 corresponds to a continuous pattern of the measurement data (measurement data of the time sections corresponding to the indexes 1 to 10 of the conceptual representation 22 out of the measurement data (current waveform) 21 illustrated in FIG. 2A).

When detecting the index 1, which is the common data between the intermittent data 42a and 42e in FIG. 4C, the analysis apparatus 10 may determine the section of the common data between the intermittent data 42a and 42e by comparing feature values of respective waveform patterns of each time section of the intermittent data 42a and 42e (the feature value may be a peak value, etc. of a waveform in the time domain and/or a power spectrum, etc. in the frequency domain).

Various methods for determining whether a repeating pattern for one cycle has been extracted or not (whether estimation has been completed or not) may be used in the analysis apparatus 10. For example, in the analysis apparatus 10, a threshold value for occurrence frequency of new common data is set with respect to common data among intermittent data, and the analysis apparatus 10 may determine that a repeating pattern for one cycle is estimated when the occurrence frequency is equal to or less than the threshold value.

Alternatively, in a case where the analysis apparatus 10 updates a repeating pattern using intermittent data by using common data as a clue, a threshold value may be set for a change amount in a repeating pattern and it may be determined that an estimation of a repeating pattern for one cycle is done when the change amount becomes equal to or less than the threshold value. The analysis apparatus 10 may continue to receive intermittent data from the measurement apparatus 11 and repeat processing of estimating a repeating pattern using the common section as a clue until a repeating pattern for one cycle is extracted.

Further, in a case where a data loss occurs due to malfunction/failure of any of the measurement part 111, the processing part 113, and the communication part 112 in the measurement apparatus 11, the analysis apparatus 10 may also estimate a standard repeating pattern using the common portion (section) of intermittent data (partial data) caused by the data loss and received from the measurement apparatus 11.

The analysis apparatus 10 stores the estimated pattern (a repeating pattern for one cycle) 43 in a storage part (not shown in FIG. 4D; refer to a standard pattern storage part 102C in FIG. 6) as a standard repeating pattern (standard pattern) that serves as a reference in the measurement apparatus 11.

When performing determination of measurement data from the measurement apparatus 11, the analysis apparatus 10 refers to the standard repeating pattern (standard pattern) that has been already learned and determines anomaly in operation if, for example, the measurement data intermittently transmitted by the measurement apparatus 11 deviates from the standard pattern.

Figure 4E:
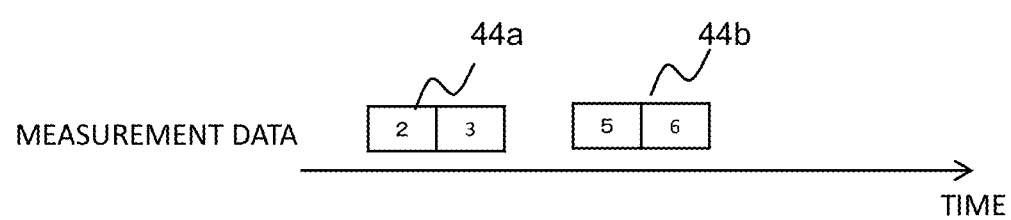
FIG. 4E is a diagram illustrating an example embodiment.

FIG. 4E is a diagram illustrating an example of measurement data intermittently transmitted by the measurement apparatus 11. In the example of FIG. 4E, if intermittent data 44a constituted by the consecutive indexes 2 and 3 in the conceptual representation is not found in the data of any two consecutive indexes in the conceptual representation of the standard repeating pattern (standard pattern), it will be determined that an anomaly has occurred. Further, if intermittent data 44b constituted by the consecutive indexes 5 and 6 in the conceptual representation is not found in the data of any two consecutive indexes in the conceptual representation of the standard repeating pattern (standard pattern), it will be determined that an anomaly has occurred.

Note that change or loss of data occurring due to malfunction, failure or the like of any of the measurement part 111, the processing part 113, and the communication part 112 in the measurement apparatus 11 is detected as an anomaly.

Figure 1B:
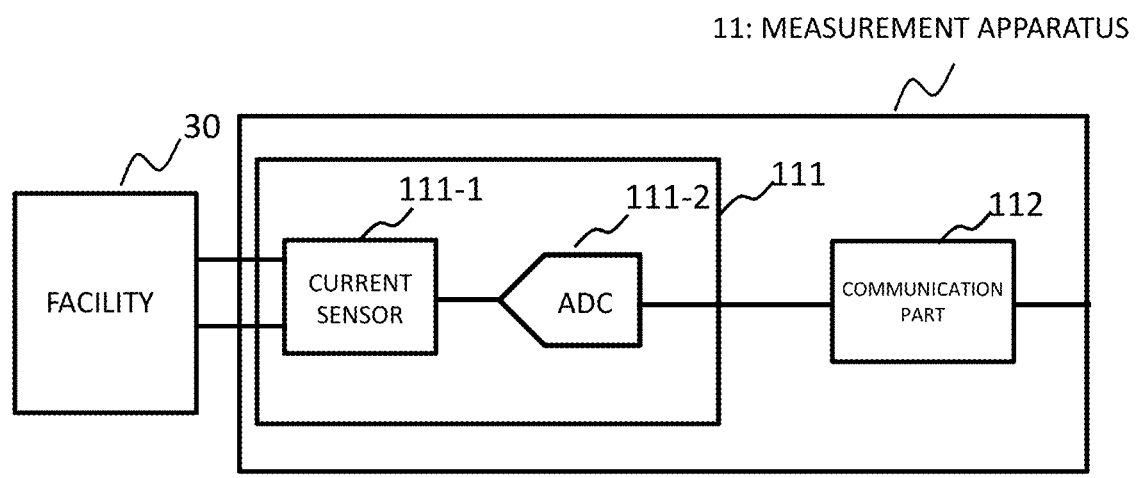
FIG. 1B is a diagram illustrating a measurement apparatus.
Figure 5A:
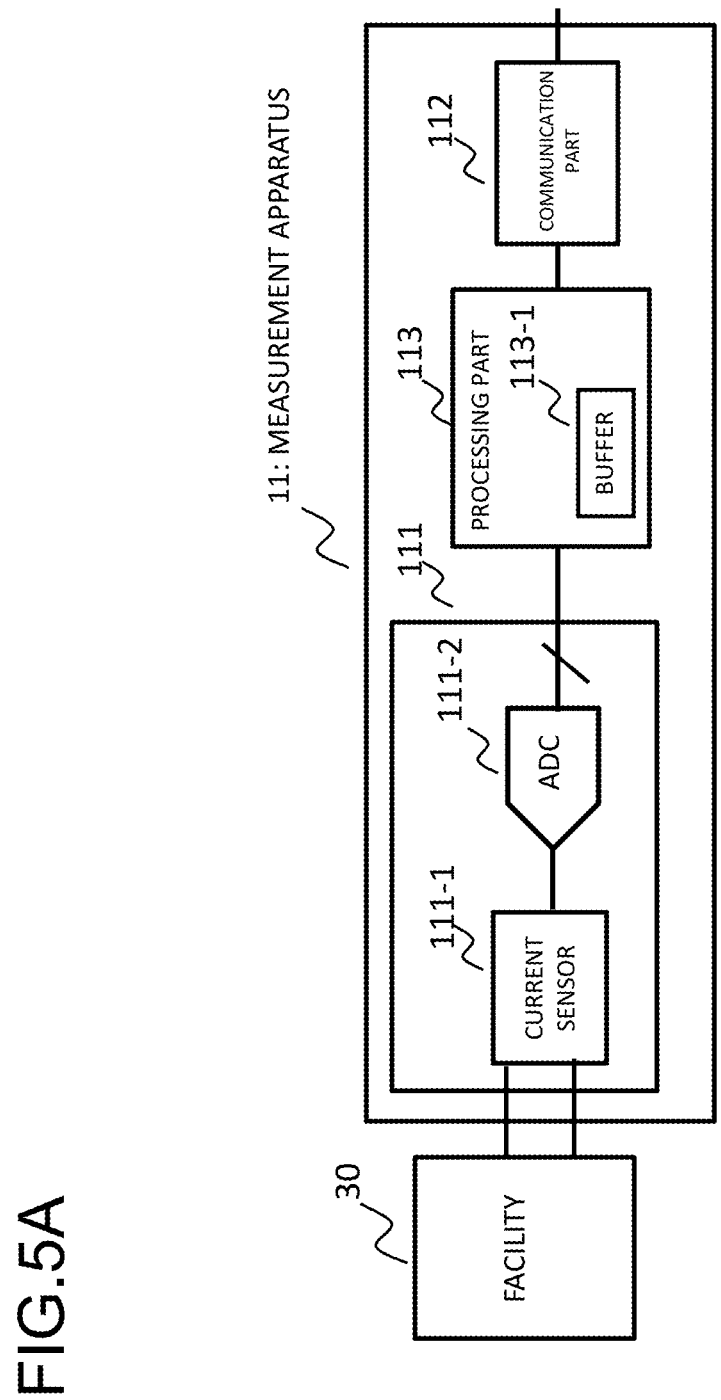
FIG. 5A is a diagram illustrating an example of the measurement apparatus according to an example embodiment.

FIG. 5A is a diagram illustrating a configuration example of the measurement apparatus 11 according to the present example embodiment. The measurement apparatus 11 further includes a processing part 113, in addition to the measurement part 111 and the communication part 112 illustrated in FIG. 1B. The measurement part 111 measures a current (power supply current) flowing through a facility 30 of a measurement target. The processing part 113 transmits to the communication part 112 intermittent data obtained by decimating digital data (measurement data) output from the analog-to-digital converter (ADC) 111-2 of the measurement part 111. The measurement part 111 may include an RMS circuit (not shown) that calculates an RMS value (Root Mean Square value) of a current from an output of the analog-to-digital converter 111-2 and output the RMS value.

The processing part 113 may temporarily store digital data (for example, parallel data) from the measurement part 111 in a buffer memory 113-1 (for example, a FIFO (First In First Out)), partition the data per a predetermined time section, and transmit the measurement data of selected time sections via the communication part 112. For example, in the example of FIG. 4B, the processing part 113 may store measurement data (waveform data) corresponding to three consecutive indexes of the conceptual representation in the buffer memory and transmit, through the communication part 112, the measurement data (waveform data) corresponding to the first two indexes out of the stored data.

For example, the buffer memory 113-1 may be configured to have a double buffer structure, and while stored data in one buffer memory is read and transmitted to the communication part 112, digital data output from the analog-to-digital converter (ADC) 111-2 may be written to the other buffer memory, though not limited thereto. Further, the communication part 112 includes a transmission buffer (not shown) that stores measurement data (partial data transmitted intermittently) of a time section selected by the processing part 113, and data of a decimated time section is not transmitted (not stored in the transmission buffer).

Figure 5B:
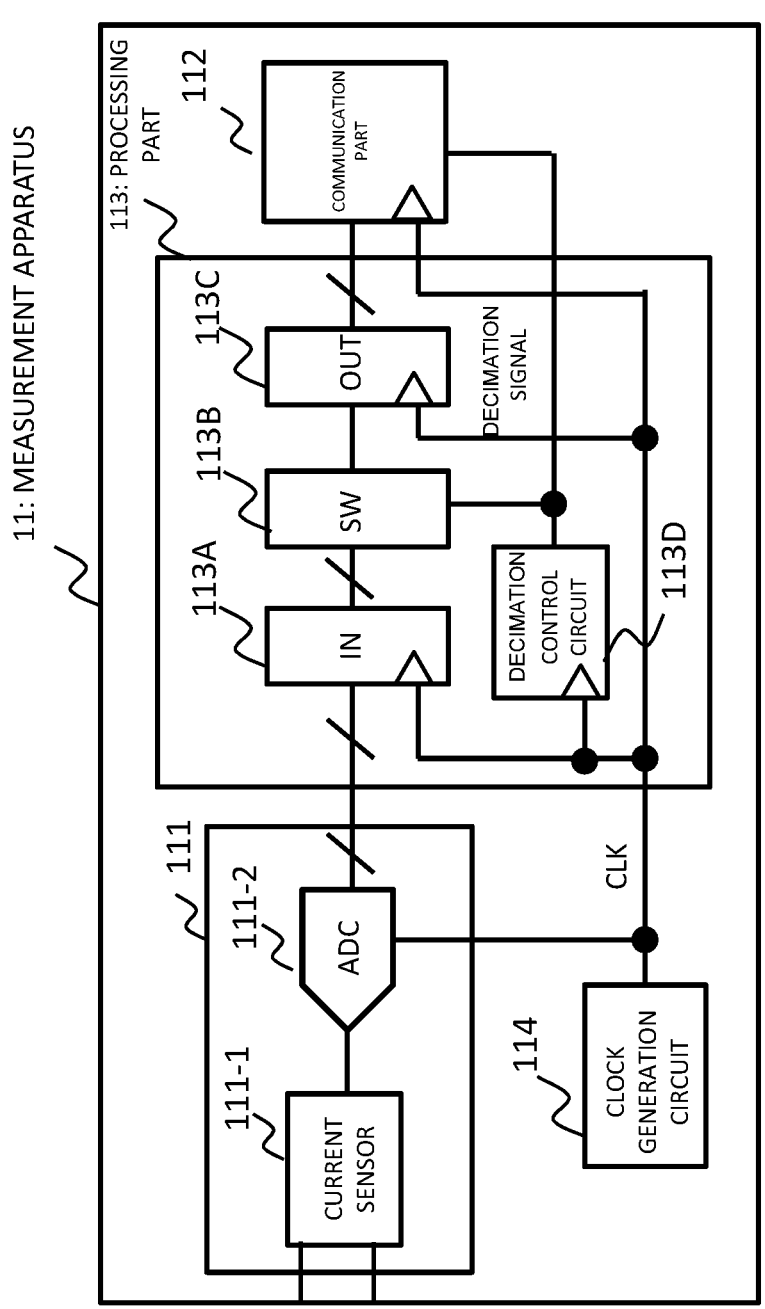
FIG. 5B is a diagram illustrating an example of the measurement apparatus according to an example embodiment.

FIG. 5B is a diagram schematically illustrating another configuration example of the measurement apparatus 11 according to the present example embodiment. Note that in FIG. 5B, a facility to be measured is omitted. In the example of FIG. 5B, the processing part 113 is constituted by a decimation control circuit 113D. A clock generation circuit 114 in FIG. 5B supplies an operation clock signal CLK to the measurement part 111, the processing part 113, and the communication part 112. Note that a clock generation circuit is also provided in FIG. 5A, but not illustrated. Although a common clock signal CLK is supplied to the analog-to-digital converter 111-2, the processing part 113, and the communication part 112 in FIG. 5B, for the sake of simplicity, a plurality of clock signals, synchronized with each other, having different frequencies may be supplied. As in FIG. 5A, the measurement part 111 may include an RMS circuit (not shown) that calculates an RMS value of a current from the output of the analog-to-digital converter 111-2 and output the RMS value as measurement data.

In the processing part 113, the decimation control circuit 113D starts counting the clock signal CLK in order to measure a decimation time section from a preset decimation start time (for example, at an end time point of a time section of intermittent data) and activates a decimation signal. Then, when counting the clock signal for a duration of a decimation time section, the decimation control circuit 113D resets the count value and deactivates the decimation signal. Next, the decimation control circuit 113D counts the clock signal for a duration of the time section of intermittent data, and enters again into a decimation time section from a time point at which the clock signal for has been counted for the duration of the time section of intermittent data. While the decimation signal from the decimation control circuit 113D is activated, a switch 113B (for example, a transfer gate) is turned off (not-conductive) and a signal from an input circuit (IN) 113A (latched data of output from the analog-to-digital converter 111-2) is not supplied to an output circuit (OUT) 113C. While the decimation signal is deactivated, the switch 113B is turned on (conductive) and the signal from the input circuit (IN) 113A is outputted to the output circuit (OUT) 113C. Note that the decimation control circuit 113D may count a signal obtained by performing frequency division of the clock signal CLK. In FIG. 5B, the output circuit (OUT) 113C may be so configured that when the decimation signal transitions from a deactivated state to an activated state, data which the output circuit (OUT) 113C outputs immediately before the transition may be kept to be outputted from the output circuit (OUT) 113C, during an activation period of the decimation signal after the transition.

In the measurement apparatus 11, the decimation time section is set to a time section corresponding to one index of the conceptual representation 42 of measurement data in the case of FIGS. 4A and 4B. The decimation control circuit 113D may be configured to supply the decimation signal to the communication part 112. In this case, the communication part 112 does not transmit data of time sections during which the decimation signal is activated. It may be so configured that an intermittent data time section and a decimation time section in the measurement apparatus 11 may be variably set by, for example, the analysis apparatus 10 via a network. Counting of the clock signal by the decimation control circuit 113D may be set to a predetermined timing after a start of the analog-to-digital conversion operation by the analog-to-digital converter 111-2. When the analog-to-digital conversion operation starts may be determined based on a trigger signal supplied to the measurement apparatus 11 by a facility of a measurement target. In FIG. 5B, the switch 113B is provided to facilitate explanation, however, instead of the switch 113B, a signal (gated clock) obtained by gating the clock signal CLK with the decimation signal from the decimation control circuit 113D may be supplied to, for example, the output circuit 113C. In FIG. 5B, the input circuit 113A and the output circuit 113C are edge trigger circuits (for example, D register), however, it goes without saying that they are not limited to such a configuration.

FIG. 6 is a diagram illustrating a configuration example of the analysis apparatus 10. The analysis part 102 of the analysis apparatus 10 includes a control part 102A, an estimation part 102B, the standard pattern storage part 102C, and a determination part 102D.

The control part 102A controls switching of an operating mode between a learning mode and a determination mode. The control part 102A activates the estimation part 102B in the learning mode (the determination part 102D is deactivated). The control part 102A activates the determination part 102D in the determination mode (the estimation part 102B may be deactivated).

In the learning mode, the estimation part 102B estimates a repeating pattern from intermittent data series of measurement data that the communication part 101 received from the measurement apparatus 11, and stores the estimated repeating pattern in the standard pattern storage part 102C.

As described above, for example, when extracting (detecting) the index 1 which corresponds to common data between the intermittent data 42a and the intermittent data 42e in FIG. 4C, the estimation part 102B may determine the common data section between the intermittent data 42a and the intermittent data 42e by comparing feature values of the waveform patterns (feature value being a peak value or the like of a waveform in a time domain or a power spectrum or the like in a frequency domain) in each time section of the intermittent data 42a and the intermittent data 42e.

Further, when a repeating pattern is constituted by the indexes 1 to 10 of the conceptual representation as illustrated in FIG. 4A, the analysis apparatus 10 may determine that estimation of a repeating pattern of continuous sections is performed when a waveform pattern of a section (for example, with an index i: i=1 to 10) is identical to a waveform pattern of a corresponding section that is ten sections before the index i of the section or similarity between the two waveform patterns of the two sections is higher than a predetermined threshold value. The estimation part 102B may receive intermittent data from the measurement apparatus 11 and repeat the processing of determining whether or not a repeating pattern has been estimated using a common section as a clue until the estimation of a repeating pattern is completed. The estimation part 102B stores a continuous repeating pattern estimated in the standard pattern storage part 102C as a standard repeating pattern (standard pattern) serving as a reference.

In the determination mode, the determination part 102D collates intermittent data (intermittent data of a determination target) of measurement data that the communication part 101 received from the measurement apparatus 11 with the standard repeating pattern stored in the standard pattern storage part 102C and determines presence of an anomaly (change). The determination part 102D determines that an anomaly exists when the partial data intermittently transmitted by the measurement apparatus 11 is not included in a repeating pattern for one cycle stored as the standard pattern. The determination part 102D may output a determination result to the display apparatus 14.

Figure 7A:
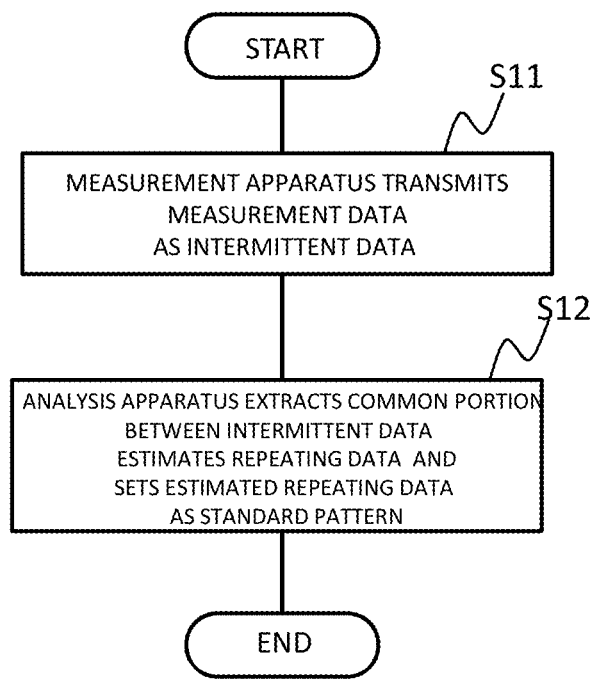
FIG. 7A is a diagram for explaining an operation example of an example embodiment.
Figure 7B:
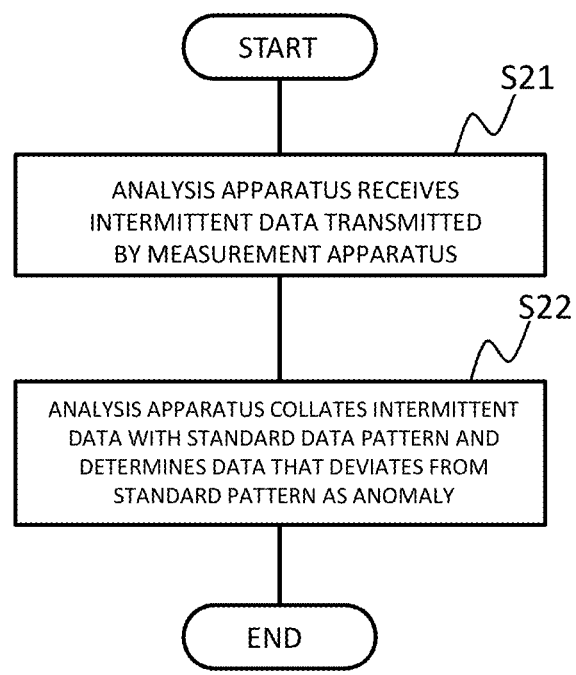
FIG. 7B is a diagram for explaining an operation example of an example embodiment.

FIGS. 7A and 7B are flowcharts for explaining respectively the operation of the analysis apparatus 10 in learning and determination modes according to the example embodiment.

With reference to FIG. 7A, the measurement apparatus 11 culls measurement data such as a current of a facility and transmits intermittent data (S11).

The analysis apparatus 10 receives the intermittent data transmitted from the measurement apparatus 11, estimates a repeating pattern for one cycle by extracting a common portion between a pair of intermittent data, and stores the pattern as a standard pattern serving as a reference in determining an anomaly (S12). Note that the analysis apparatus 10 may sequentially change a length of the intermittent data (or a length of decimated data between adjacent pieces of intermittent data) in the received intermittent data until a repeating pattern for one cycle is estimated.

With reference to FIG. 7B, the measurement apparatus 11 transmits intermittent data, and the analysis apparatus 10 receives the intermittent data (intermittent data of a determination target) transmitted by the measurement apparatus 11 (S21).

The analysis apparatus 10 collates the intermittent data with the standard data pattern and determines that data that deviates from the standard pattern as anomaly (S22).

Figure 8:
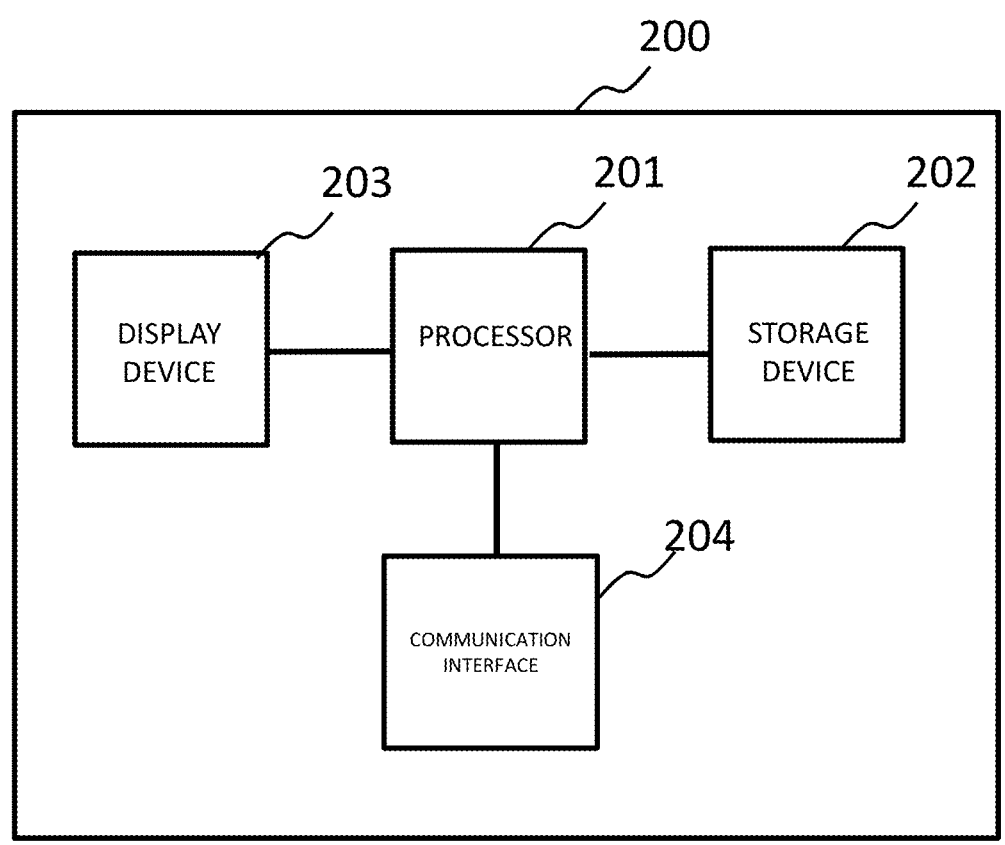
FIG. 8 is a diagram illustrating a configuration example of the analysis apparatus according to an example embodiment.

The analysis apparatus 10 may be implemented in a computer apparatus 200 as schematically illustrated in FIG. 8. With reference to FIG. 8, the computer apparatus 200 includes a processor 201, a storage apparatus 202 that includes at least one of a semiconductor memory (for example RAM (Random Access Memory), ROM (Read Only Memory) or EEPROM (Electrically Erasable and Programmable ROM), etc.), HDD (Hard Disk Drive), CD (Compact Disc), and DVD (Digital Versatile Disc), a display apparatus 203, and a communication interface 204. For example, the display apparatus 203 may correspond to the display apparatus 14 illustrated in FIG. 3. The communication interface 204 may correspond to the communication part 101 in FIG. 3. For example, the functions of the analysis apparatus 10 of the example embodiment may be realized by storing a program that implements the processing of the analysis part 102 illustrated in FIGS. 3 and 6 in the storage apparatus 202 and having the processor 201 read and execute the program. The storage apparatus 202 may include the standard pattern storage part 102C illustrated in FIG. 6.

According to the present example embodiment, it becomes possible to avoid a buffer overflow such as network congestion in the analysis apparatus 10 implemented as an edge apparatus or the like by having the measurement apparatus 11 transmit measurement data as intermittent data. The analysis apparatus 10 is able to determine presence of an anomaly in a facility of a measurement target by reconstructing continuous repeating data for one cycle (i.e., by refilling data section decimated or lost to generate continuous repeating data for one cycle), from a set of partial data received intermittently and collating data (partial data) transmitted intermittently from the measurement apparatus 11 with the reconstructed pattern as a reference pattern in a determination mode. Further, it is also possible to infer malfunction, failure, or the like in the measurement apparatus (the measurement part, the processing part, and the communication part).

The example embodiment above describes an example in which the measurement apparatus 11 measures a current signal, however, the measurement data (time-series data) is, as a matter of course, not limited to current signal data in the present example embodiment. For example, the present example embodiment can be applied to voltage, power, mechanical vibration, sound (operation sound), temperature, humidity, pressure, light, color, image, video, odor, etc., as long as the measurement data is a signal waveform related to the operation of a facility and a repeating pattern can be observed therein. Further, in the present example embodiment, it is a matter of course that the facility 30 of a measurement target may be applicable to an electrical facility (equipment) other than a manufacturing facility.

Further, each disclosure of Patent Literatures 1 to 3 cited above is incorporated herein in its entirety by reference thereto. It is to be noted that it is possible to modify or adjust the example embodiments or examples within the whole disclosure of the present invention (including the Claims) and based on the basic technical concept thereof. Further, it is possible to variously combine or select a wide variety of the disclosed elements (including the individual elements of the individual supplementary notes, the individual elements of the individual example embodiments or examples and the individual elements of the individual figures) within the whole disclosure of the present invention. That is, it is self-explanatory that the present invention includes any types of variations and modifications to be done by a skilled person according to the whole disclosure including the Claims, and the technical concept of the present invention. Particularly, any numerical ranges disclosed herein should be interpreted that any intermediate values or subranges falling within the disclosed ranges are also concretely disclosed even without specific recital thereof.

What is claimed is:

1. An analysis apparatus comprising:
 a processor;
 a memory storing program instructions executable by the processor; and
 a receiver that receives intermittent data from a measurement apparatus capable of transmitting measurement data as the intermittent data obtained by decimating the measurement data, wherein
 the processor, when executing the program instructions stored in the memory,
 refills one or more data sections of the measurement data that has been decimated to reconstruct, in a first mode, a standard data pattern serving as a reference, by placing a pair of first and second pieces of the intermittent data on common sections of the pair so as to overlap one other on a time axis, the pair of the first and second pieces of the intermittent data received at different time points from the measurement apparatus, and determines, in a second mode, presence of an anomaly of the intermittent data within a determination target received from the measurement apparatus by referring to the reconstructed standard data pattern.

2. The analysis apparatus according to claim 1, comprising a storage, wherein the processor reconstructs, in the first mode, a repeating pattern for a cycle of the measurement data measured by the measurement apparatus, based on the common sections of the pair, where each of the first and second pieces of the pair includes at least two data sections received at time points spaced apart by an integer multiple of the cycle from the measurement apparatus, and stores, in the storage, the repeating pattern for the cycle as the standard data pattern.

3. The analysis apparatus according to claim 2, wherein the processor determines, in the second mode, the anomaly when in the intermittent data within the determination target received from the measurement apparatus, there is data not included in the repeating pattern for the cycle stored in the storage.

4. A computer-based facility state monitoring method comprising:

receiving intermittent data from a measurement apparatus capable of transmitting measurement data of a facility of a measurement target as the intermittent data by decimating the measurement data;

refilling one or more data sections of the measurement data that has been decimated to reconstruct, in a first mode, a standard data pattern serving as a reference, by placing a pair of first and second pieces of the intermittent data on common sections of the pair so as to overlap one other on a time axis, the pair of the first and second pieces of the intermittent data received at different time points from the measurement apparatus; and determining, in a second mode, presence of an anomaly of the intermittent data within a determination target received from the measurement apparatus by referring to the reconstructed standard data pattern.

5. The computer-based facility state monitoring method according to claim 4, comprising:

reconstructing, in the first mode, a repeating pattern for a cycle of the measurement data measured by the measurement apparatus based on the common sections of the pair, where each of the first and second pieces of the pair includes at least two data sections received at time points spaced apart by an integer multiple of the cycle from the measurement apparatus; and storing, in a storage, the reconstructed repeating pattern for the cycle as the standard data pattern.

6. The computer-based facility state monitoring method according to claim 5, comprising:

determining, in the second mode, the anomaly when in the intermittent data within the determination target received from the measurement apparatus, there is data not included in the repeating pattern for one cycle stored in the storage.

7. A non-transitory computer readable medium storing a program causing a computer to execute processing comprising:

receiving intermittent data from a measurement apparatus capable of transmitting measurement data of a facility of a measurement target as the intermittent data by decimating the measurement data;

refilling one or more data sections of the measurement data that has been decimated to reconstruct, in a first mode, a standard data pattern serving as a reference, by placing a pair of first and second pieces of the intermittent data on common sections of the pair so as to overlap one other on a time axis, the pair of the first and second pieces of the intermittent data received at different time points from the measurement apparatus; and determining, in a second mode, presence of an anomaly of the intermittent data within a determination target received from the measurement apparatus by referring to the reconstructed standard data pattern.

8. The non-transitory computer readable medium according to claim 7, storing the program causing the computer to execute the processing comprising:

reconstructing, in the first mode, a repeating pattern for a cycle of the measurement data measured by the measurement apparatus based on the common sections of the pair, where each of the first and second pieces of the pair includes at least two data sections received at time points spaced apart by an integer multiple of the cycle from the measurement apparatus; and storing, in a storage, the reconstructed repeating pattern for the cycle as the standard data pattern.

9. The non-transitory computer readable medium according to claim 8, storing the program causing the computer to execute the processing comprising:

determining, in the second mode, the anomaly when in the intermittent data within the determination target received from the measurement apparatus, there is data not included in the repeating pattern for one cycle stored in the storage.

10. The analysis apparatus according to claim 1, wherein the processor, in the first mode, extracts the common sections of the pair of the first and second pieces of the intermittent data, where each of the first and second pieces of the pair includes at least two data sections, based on a comparison of waveform patterns of the at least two data sections of the pair arranges the first and second pieces of the pair of the intermittent data on the common sections so as to overlap one other on the time axis to refill the one or more data sections of the measurement data that has been decimated by reconstructing a repeating pattern for a cycle of the measurement data, and stores, in a storage, the repeating pattern for the cycle as the standard data pattern.

11. The analysis apparatus according to claim 10, wherein the common sections of the first and second pieces of the pair of the intermittent data are spaced apart in time by at least the cycle of the repeating pattern.

12. The computer-based facility state monitoring method according to claim 4, comprising:

extracting, in the first mode, the common sections of the pair of the first and second pieces of the intermittent data, where each of the first and second pieces of the pair includes at least two data sections, based on a comparison of waveform patterns of the at least two data sections of the pair; and arranging the first and second pieces of the pair of the intermittent data on the common sections so as to overlap one other on the time axis to refill the one or more data sections of the measurement data that has been decimated by reconstructing a repeating pattern for a cycle of the measurement data; and storing, in a storage, the repeating pattern for the cycle as the standard data pattern.

13. The computer-based facility state monitoring method according to claim 12, comprising:
extracting the common sections of the first and pieces of the pair of the intermittent data as spaced apart in time by at least the cycle of the repeating pattern.

14. The non-transitory computer readable medium according to claim 7, storing the program causing the computer to execute the processing comprising:
extracting, in the first mode, the common sections of the pair of the first and second pieces of the intermittent data, where each of the first and second pieces of the pair includes at least two data sections, based on a comparison of waveform patterns of the at least two data sections of the each pair; and
arranging the first and second pieces of the pair of the intermittent data on the common sections so as to overlap one other on the time axis to refill the one or more data sections of the measurement data that has been decimated by reconstructing a repeating pattern for a cycle of the measurement data; and
storing, in a storage, the repeating pattern for the cycle as the standard data pattern.

15. The non-transitory computer readable medium according to claim 14, storing the program causing the computer to execute the processing comprising
extracting the common sections of the first and pieces of the pair of the intermittent data as spaced apart in time by at least the cycle of the repeating pattern.

\* \* \* \* \*